(12) United States Patent
Sunwoo et al.

(10) Patent No.: US 11,483,012 B2
(45) Date of Patent: Oct. 25, 2022

(54) DECODING SYSTEM AND METHOD FOR LOW LATENCY BIT-FLIPPING SUCCESSIVE CANCELLATION DECODING FOR POLAR CODES

(71) Applicant: AJOU UNIVERSITY INDUSTRY-ACADEMIC COOPERATION FOUNDATION, Suwon-si (KR)

(72) Inventors: Myung Hoon Sunwoo, Seoul (KR); Seung Yong Kim, Yangju-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 17/178,356

(22) Filed: Feb. 18, 2021

(65) Prior Publication Data
US 2021/0288664 A1 Sep. 16, 2021

(30) Foreign Application Priority Data
Mar. 16, 2020 (KR) .......................... 10-2020-0032082

(51) Int. Cl.
*H03M 13/29* (2006.01)
*H03M 13/09* (2006.01)
(Continued)

(52) U.S. Cl.
CPC ....... *H03M 13/2906* (2013.01); *H03M 13/09* (2013.01); *H03M 13/1108* (2013.01);
(Continued)

(58) Field of Classification Search
CPC .. H03M 13/13; H03M 13/2927; H03M 13/09; H03M 13/1108; H03M 13/1125;
(Continued)

(56) References Cited

U.S. PATENT DOCUMENTS

2014/0173376 A1* 6/2014 Jeong .................... H04L 1/0041
714/755
2017/0214416 A1* 7/2017 Ge ......................... H03M 13/13
(Continued)

OTHER PUBLICATIONS

X. Liang, H. Zhou, Z. Wang, X. You and C. Zhang, "Segmented successive cancellation list polar decoding with joint BCH-CRC codes," 2017 51st Asilomar Conference on Signals, Systems, and Computers, Pacific Grove, CA, USA, 2017, pp. 1509-1513.*
(Continued)

*Primary Examiner* — Steve N Nguyen
(74) *Attorney, Agent, or Firm* — Sughrue Mion, PLLC

(57) ABSTRACT

A method for decoding a signal encoded with polar codes by a decoding system is provided. The method comprises receiving, from a transmission system, a signal in which a plurality of cyclic redundancy checks (CRCs) are encoded by the polar codes, the plurality of CRCs being inserted into positions determined based on a plurality of information bits, a number of the plurality of information bits and a total code length, and decoding a code section including bits ranging from a first bit of the signal to a position where a last bit of a first CRC is inserted. The method further comprises re-performing successive cancellation flip decoding for the decoded code section, or determining whether to decode a next code section adjacent to the decoded code section, based on whether a CRC is detected in the decoded code section.

10 Claims, 8 Drawing Sheets

(51) Int. Cl.
*H03M 13/13* (2006.01)
*H03M 13/11* (2006.01)

(52) U.S. Cl.
CPC ....... *H03M 13/1125* (2013.01); *H03M 13/13* (2013.01); *H03M 13/2948* (2013.01)

(58) Field of Classification Search
CPC ......... H03M 13/2906; H03M 13/2948; H03M 13/091
See application file for complete search history.

(56) References Cited

U.S. PATENT DOCUMENTS

| | | | | |
|---|---|---|---|---|
| 2017/0366199 | A1* | 12/2017 | Ge | H04L 1/0057 |
| 2018/0034589 | A1* | 2/2018 | Sun | H03M 13/091 |
| 2018/0198894 | A1* | 7/2018 | Nammi | H04L 47/821 |
| 2018/0226999 | A1* | 8/2018 | Wang | H04L 1/0064 |
| 2018/0248567 | A1* | 8/2018 | Qu | H03M 13/11 |
| 2018/0358985 | A1* | 12/2018 | Kim | H03M 13/2792 |
| 2019/0097756 | A1* | 3/2019 | Chatterjee | H04L 1/0041 |
| 2019/0097760 | A1* | 3/2019 | Hwang | H03M 13/09 |

OTHER PUBLICATIONS

W. Song, H. Zhou, Y. Zhao, S. Zhang, X. You and C. Zhang, "Low-complexity segmented CRC-aided SC stack decoder for polar codes," 2016 50th Asilomar Conference on Signals, Systems and Computers, Pacific Grove, CA, USA, 2016, pp. 1189-1193.*

X. Wang, K. Qin, Z. Zhu and Z. Zhang, "Low Complexity Blind Detection Scheme for Polar Codes: A Segmented CRC Approach," 2018 10th International Conference on Wireless Communications and Signal Processing (WCSP), Hangzhou, China, 2018, pp. 1-5.*

R. Guo, K. Chen and H. Liu, "Multi-CRC Polar Codes and M-SCFlip-Based Decoding," in IEEE Access, vol. 7, pp. 98366-98373, 2019.*

S. Li, Y. Deng, X. Gao, H. Li, L. Guo and Z. Dong, "Generalized Segmented Bit-Flipping Scheme for Successive Cancellation Decoding of Polar Codes With Cyclic Redundancy Check," in IEEE Access, vol. 7, pp. 83424-83436, 2019.*

A. Cao, L. Zhang, J. Qiao and Y. He, "An LLR-Based Segmented Flipped SCL Decoding Algorithm for Polar Codes," 2019 IEEE/CIC International Conference on Communications in China (ICCC), Changchun, China, 2019, pp. 724-729.*

H. Zhou, C. Zhang, W. Song, S. Xu and X. You, "Segmented CRC-Aided SC List Polar Decoding," 2016 IEEE 83rd Vehicular Technology Conference (VTC Spring), Nanjing, China, 2016, pp. 1-5.*

X. Liu, S. Wu, X. Xu, J. Jiao and Q. Zhang, "Improved Polar SCL Decoding by Exploiting the Error Correction Capability of CRC," in IEEE Access, vol. 7, pp. 7032-7040, 2019.*

* cited by examiner

DECODING SYSTEM AND METHOD FOR LOW LATENCY BIT-FLIPPING SUCCESSIVE CANCELLATION DECODING FOR POLAR CODES

CROSS-REFERENCE TO RELATED APPLICATION(S)

This application claims the benefit under 35 USC § 119(a) of Korean Patent Application No. 10-2020-0032082, filed on Mar. 16, 2020, in the Korean Intellectual Property Office, the entire disclosure of which is incorporated herein by reference for all purposes.

BACKGROUND

1. Field

The following description relates to a decoding system and a method for low latency bit-flipping successive cancellation decoding for polar codes.

2. Description of Related Art

In recent years, with the continuous growth of Internet traffic in line with the increase in transmission bandwidth and the emergence of new communication services (LTE, 5G, and the like) in broadband communication networks, wired and wireless communication systems have been changed to enable high-speed data transmission. In communication systems, a factor as important as high-speed data transmission is the error-correcting code.

The polar code is a linear block error-correcting code that is drawing a lot of attention, such as being employed as a 5G control channel code. A decoding algorithm for the polar code may apply a probability-based successive cancellation algorithm for decoding. The successive cancellation algorithm performs decoding by using a log-likelihood ratio (LLR) value of a symbol received from a channel for decoding the polar code.

The successive cancellation algorithm, which is the decoding algorithm for the polar code, has a feature of achieving channel capacity over an infinite length in a binary input discrete memoryless channel by using channel polarization. However, it has a limitation in that, compared to the low density parity check (LDPC) code or turbo code of similar code length, error-correcting performance is degraded.

In order to overcome the limitation, a successive cancellation list decoding technique, a bit-flipping successive cancellation technique, and the like have been suggested. In the bit-flipping successive cancellation technique, a cyclic redundancy check (CRC) is used as an outer code. Then, a decoded bit with a high possibility of an error is found, and bit-flipping is performed on the corresponding bit. A process for decoding the polar code by using the existing bit-flipping successive cancellation (SC-Flip) decoding algorithm is as follows.

A polar coder completes the successive cancellation decoding process and performs CRC detection. If the CRC detection fails, the polar coder finds the smallest log-likelihood ratio value, flips the corresponding bit, and then repeats the decoding process from the position of the corresponding bit. If the CRC detection fails again even with this procedure, the polar coder finds the smallest among the log-likelihood ratio values excluding the previously found log-likelihood ratio value. Then, the polar coder flips the corresponding bit and performs the decoding process again from the corresponding position, in a similar way.

Since the SC-Flip algorithm decodes one bit at a time and performs the iterative decoding process from the position where the smallest log-likelihood ratio value is found due to failure of CRC detection, a long latency occurs in decoding. In addition, the SC-Flip algorithm has a limitation in that the decoding time is significantly increased when the channel environment is not good and the maximum number of bit flips is large.

SUMMARY

Therefore, the present disclosure provides a decoding system and a method for low latency bit-flipping successive cancellation decoding for polar codes, capable of reducing latency while maintaining improved error-correcting performance compared with the bit-flipping successive cancellation (SC-flip) decoding algorithm in the related art.

In one general aspect, there is provided a method for decoding a signal encoded with polar codes by a decoding system, the method comprising:
receiving, from a transmission system, a signal in which a plurality of cyclic redundancy checks (CRCs) are encoded by the polar codes, the plurality of CRCs being inserted into positions determined based on a plurality of information bits, a number of the plurality of information bits and a total code length, decoding a code section including bits ranging from a first bit of the signal to a position where a last bit of a first CRC is inserted, and re-performing successive cancellation flip decoding for the decoded code section or determining whether to decode a next code section adjacent to the decoded code section, based on whether a CRC is detected in the decoded code section.

The decoding may comprise checking a preset maximum number of bit flips and initializing a number of bit flips for the code section, and checking log-likelihood ratio (LLR) values calculated by performing decoding from the first bit.

The determining may comprise checking whether the CRC is detected in the code section, checking whether a number obtained by increasing the number of bit flips by one is less than the maximum number of bit flips when the CRC is not detected, and performing bit-flipping decoding for the code section when the obtained number is less than the maximum number of bit flips.

The performing may comprise flipping a bit at a position having a smallest LLR value among the calculated LLR values, and performing decoding from the position of the flipped bit.

The flipping of the bit may comprise flipping an information bit when the bit at the position having the smallest LLR value is the information bit.

The checking whether the CRC is detected in the code section may comprise checking whether the code section is a last code section of the signal when the CRC is detected, and decoding the next code section adjacent to the code section when the code section is not the last code section.

The receiving may comprise receiving code section information including a number of the plurality of CRCs inserted into the encoded signal, the plurality of CRCs, and information on positions into which the plurality of CRCs are inserted.

In another general aspect, there is provided a decoding system for decoding a signal encoded with polar codes, the decoding system comprising
a communication interface configured to receive, from a transmission system, an encoded signal by being divided into a plurality of code sections based on insertion positions of a plurality of CRCs, and a processor configured to decode the encoded signal sequentially from a first code section, and re-perform successive cancellation flip decoding for a decoded code section of the plurality of code sections or determine whether to decode another code section adjacent to the code section, based on whether a CRC is detected in the code section.

The encoded signal may be a signal encoded with the polar codes by inserting the plurality of CRCs into positions determined based on a plurality of information bits included in the signal, the number of the information bits and a total code length.

The processor may be further configured to increase a number of bit flips set for bit-flipping decoding by one and check whether the number of bit flips is less than a preset maximum number of bit flips when the CRC is not detected in the code section, and perform the bit-flipping decoding for the code section when the number of bit flips is less than the maximum number of bit flips.

The processor may be further configured to flip a bit at a position having a smallest LLR value among LLR values calculated by decoding the code section, and perform decoding from the position of the flipped bit.

The processor may be further configured to check whether the code section is a last code section of the signal when the CRC is detected in the code section, and decode the other code section adjacent to the code section when the code section is not the last code section.

With the present disclosure, the error-correcting performance is excellent compared with the SC algorithm and the average decoding time is significantly reduced compared with the existing SC-flip algorithm, thereby making it possible to improve the error-correcting performance and reduce the latency for decoding.

DETAILED DESCRIPTION

Figure 1:
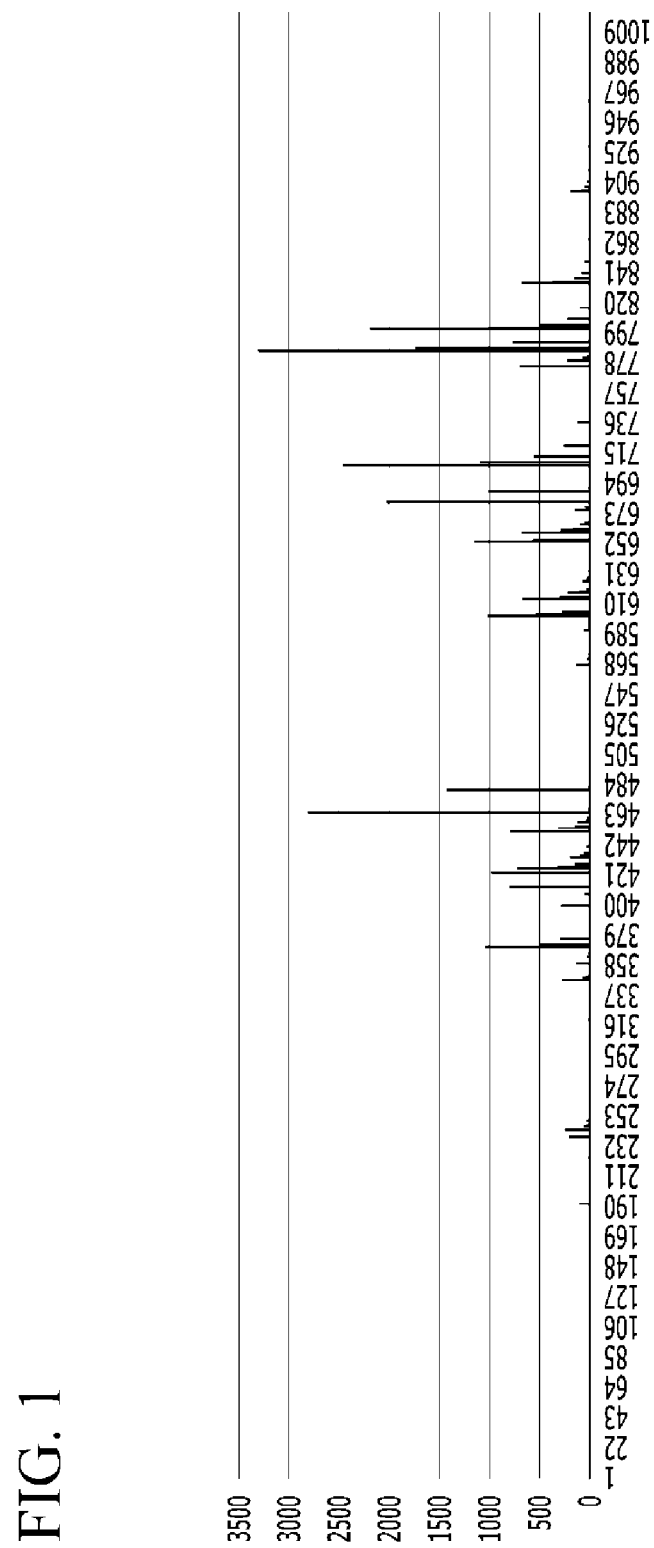
FIG. 1 is an exemplary diagram for illustrating a first error bit occurrence frequency for each index.

Hereinafter, embodiments of the present disclosure will be described in detail with reference to the accompanying drawings so that those skilled in the art may easily perform the present disclosure. However, the present disclosure may be implemented by various modifications and is not limited to the embodiments described herein. In the drawings, in order to clarify the present disclosure, parts that are not related to description are omitted and the like reference numerals represent like elements throughout the specification.

When a part "includes" an element, in the entire specification herein, unless described to the contrary, the term "includes" does not indicate that another element is excluded but instead indicates that the other element may be further included.

Hereinafter, with reference to the drawings, a decoding system for polar codes according to an embodiment of the present disclosure and a decoding method for low latency bit-flipping successive cancellation using the same will be described. Before describing an embodiment of the present disclosure, a general error bit occurrence frequency and a process for a bit-flipping successive cancellation decoding (SC-Flip) will be described with reference to FIGS. 1 to 3.

FIG. 1 is an exemplary diagram for illustrating a first error bit occurrence frequency for each index.

FIG. 1 is a graph showing a position where a first error bit occurs and the number of times error occurs at the position for each index corresponding to bits, when a receiving end receives a signal encoded with polar codes at a signal transmitting end. In FIG. 1, a graph is shown for analyzing the first error occurrence frequency for each index, which is obtained by performing simulations one-million times when the signal-to-noise ratio (SNR) is 2 and (N, k, R)=(1024, 512, 0.5). In the graph, the x-axis represents the code index, and the y-axis represents the number of times an error occurs.

That is, the graph of FIG. 1 shows the positions of the bits where the first error occurs and the number of times error occurs in the corresponding bits, when multiple data with a total code length of 1024 bits, of which 512 bits are information bits, are encoded at the receiving end. Here, N is the total code length, which is the bit length of the signal transmitted from a transmission system to a reception system, and is calculated as the sum of information bits and frozen bits. In addition, k denotes the number of information bits, and R denotes a code rate. The code rate is determined by dividing the number of information bits by the total code length.

As illustrated in FIG. 1, it can be seen that, when decoding the code encoded with polar codes, a bit in which an error first occurs is found a lot in specific positions. For example, the number of times the first error occurs in the 787th bit is about 3,305. In addition, the number of times the first error occurs in the 465th bit is about 2,814.

In this case, in the entire code, a lot of frozen bits, that is, parity bits are located in front of the 244th bit, which is the information bit. In the embodiment of the present disclosure, this position is referred as a "code section end bit" for convenience of description. A bit in which the first error occurs in the code data excluding parity bits and the occurrence frequency of the corresponding bit will be described with reference to FIG. 2.

Figure 2:
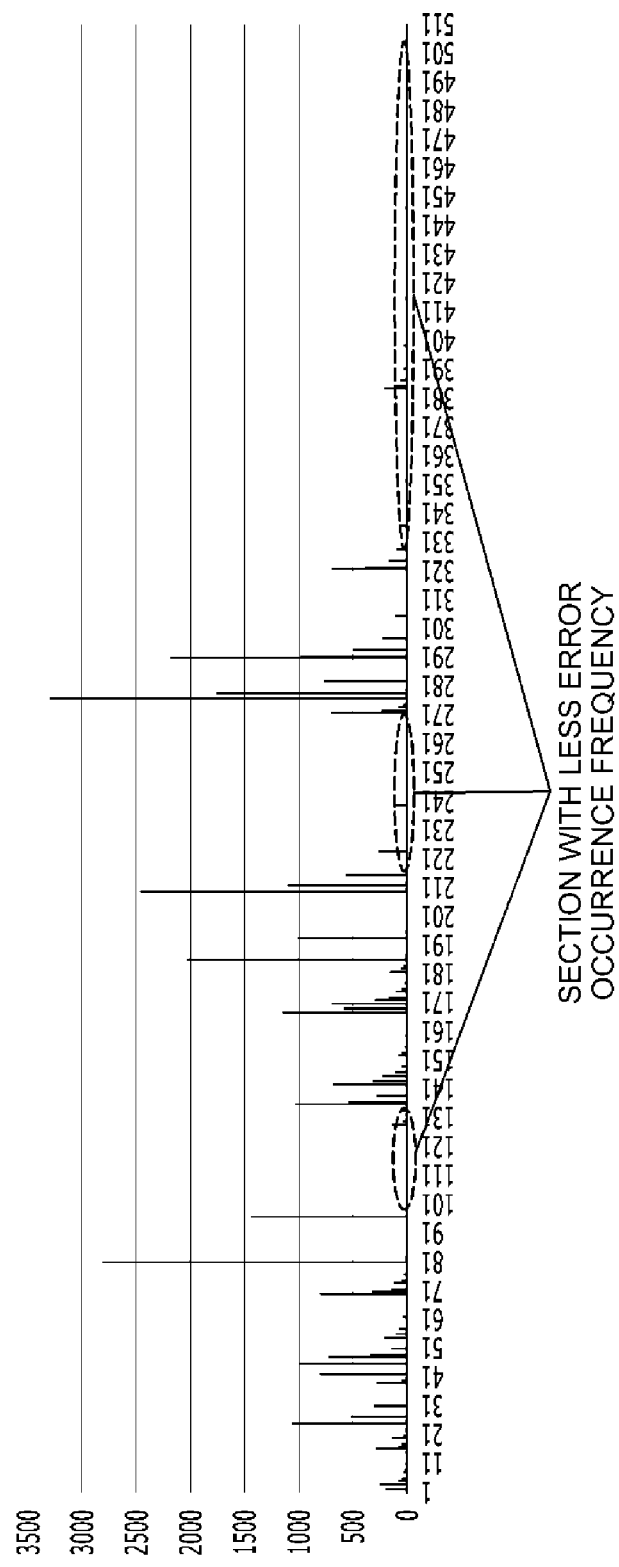
FIG. 2 is an exemplary diagram for illustrating a first error occurrence frequency of information bits excluding a frozen bit.

FIG. 2 is an exemplary diagram for illustrating a first error occurrence frequency of information bits excluding a frozen bit.

In data with a total code length of 1024 bits, of which 512 bits are information bits, for example, in the case of polar codes excluding frozen bits, there are sections with less error occurrence frequencies after the 101st, 217th, and 330th bits in 512 bits which are positions where information bits are inserted, as illustrated in FIG. 2. The 12th, 101st, 217th, and 330th bits are designated as "code section end bits", where the 12th bit corresponds to the position of the 244th bit in FIG. 1.

Accordingly, the CRC may be inserted so that the last bit of the CRC is located at the corresponding position in the coding step to perform CRC detection when decoding is completed for each code section. Based on this, it is possible to reduce the probability that, when the first decoded bit is incorrect, a subsequent bit to be decoded is also incorrectly decoded. Since bits corresponding to the 253rd, 484th, $713^{th}$, and 841st bits, and the section from the 842nd bit to the 1024th bit with respect to the data of 1024 bits are sections with less error occurrence frequency, they are set as the section in which the CRC detection is not to be performed. The sections vary depending on the total code length of the analyzed data, the number of information bits, the SNR, or the like.

Figure 3:
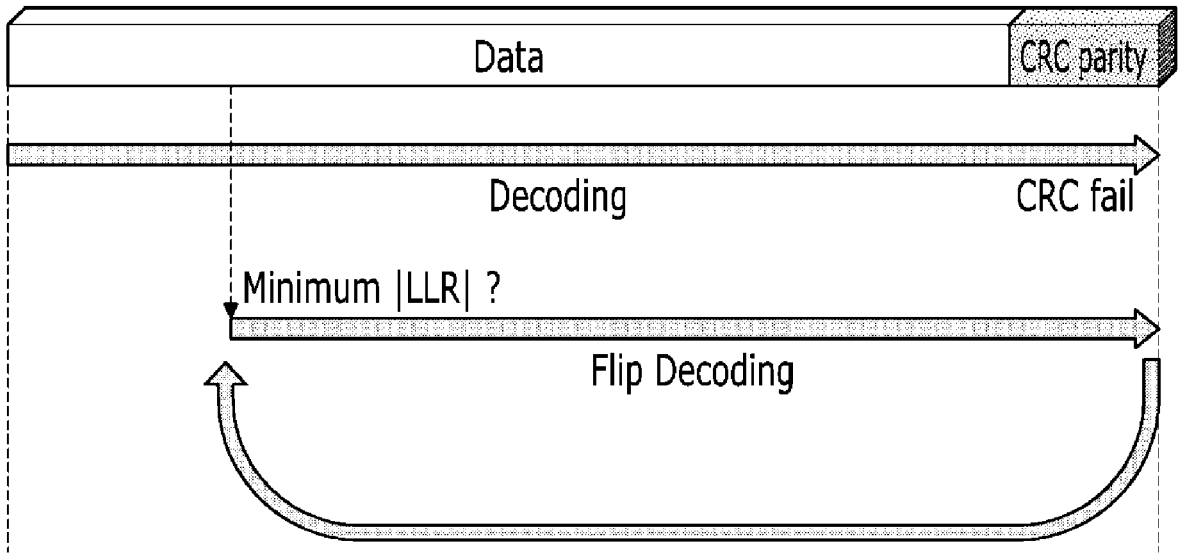
FIG. 3 is an exemplary diagram for illustrating a general decoding process for an SC-Flip algorithm.

FIG. 3 is an exemplary diagram for illustrating a general decoding process for an SC-Flip algorithm.

As illustrated in FIG. 3, when performing decoding by using the SC-Flip algorithm in the related art, the CRC detection step inserted in the last position of the entire code is entered only after all bits from the first bit to the last bit are decoded. In the embodiment of the present disclosure, CRC-16 or CRC-32 is used, and when the encoded data is 1024 bits, CRCs are inserted from the 16th or 32nd bits starting from the back.

If the CRC detection fails, a bit with the minimum LLR is found in the entire code section, and if the corresponding bit is an information bit, the bit is flipped and the decoding procedure is performed again.

If the additional CRC detection fails, a bit with the next small LLR is found, the bit at the found position is flipped, and then the decoding process is repeated. This process is repeated up to T times until CRC detection is successful.

Accordingly, when performing decoding using the SC-Flip algorithm in the related art, the bit flipping decoding procedure has to be performed for all bits, which may lead to a long latency time. In addition, when the channel environment is not good and there is a sufficient number T of bit flips, the decoding time is significantly increased, which may be a limitation.

Accordingly, in the embodiment of the present disclosure, information data to be encoded with polar codes in the encoding step is divided into a plurality of sections, and a CRC is inserted into a position obtained through analysis of FIGS. 1 and 2 for each section. Further, likewise in the decoding step, it is intended to reduce the latency time by performing the CRC check for each bit section to determine whether to proceed with bit-flipping decoding for each section even if the decoding of all bits is not performed before the final data comes out.

That is, without proceeding with the process in the decoding step until all data is decoded, the CRC check is performed in the middle to determine whether to proceed with the decoding process after bit flipping. In this way, it is possible to reduce latency while maintaining improved error correction performance compared to the SC-Flip algorithm in the related art. An embodiment of the present disclosure will be described with reference to FIGS. 4 to 6.

In the embodiment of the present disclosure, an example is presented in which the total code length to be encoded with polar codes is 1024 bits, the number of information bits is 512 bits in the 1024 bits, and the SNR is 2. Furthermore, it is assumed that through the graph analysis of FIGS. 1 and 2, the positions where the CRC bits are inserted are determined as four positions, that is, the code section end bit is the 253rd bit, the 484th bit, the 713th bit, and the 841st bit.

It is assumed that the positions are known in advance in a transmission system for encoding a code using polar codes and transmitting the encoded code, and a decoding system (or referred to as a reception system) for receiving the encoded code and decoding it. Here, the length of the CRC bits is not limited to thereto.

In addition, although the transmission system and the reception system are not directly illustrated in the drawings, they are a portion of the nodes that use a radio channel in a wireless communication environment and correspond to devices that perform communication. In addition, since a method for calculating the values of the inserted CRC bits and the LLR to be described in the following description may already be performed in various ways, the embodiment of the present disclosure is not limited to any one method.

Figure 4:
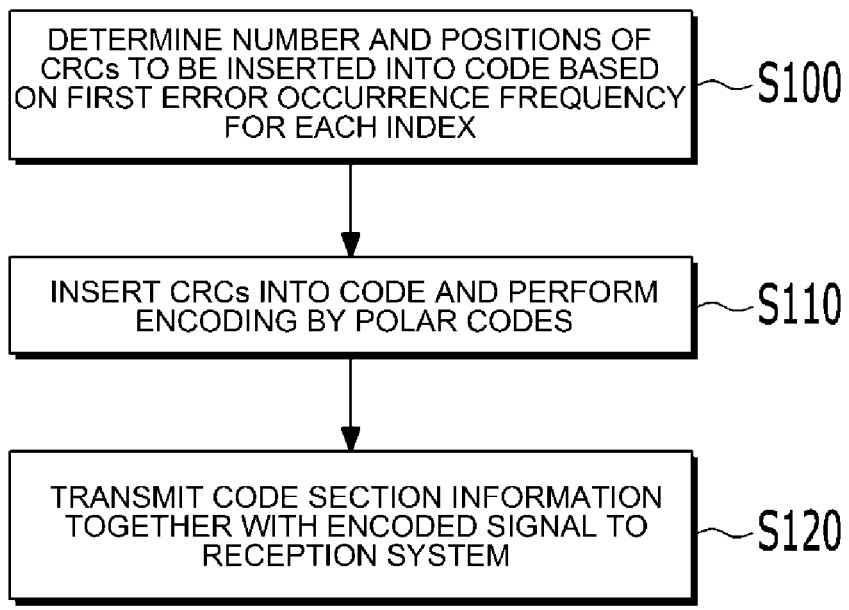
FIG. 4 is an exemplary diagram for determining a CRC position based on an error occurrence frequency according to an embodiment of the present disclosure.

FIG. 4 is an exemplary diagram for determining a CRC position based on an error occurrence frequency according to an embodiment of the present disclosure.

As illustrated in FIG. 4, the transmission system determines the index at which the first error has occurred based on previously transmitted and received signals, and the number of CRCs to be inserted into the code and CRC insertion positions based on an error occurrence frequency indicating how many times first errors have occurred for each index (S100). That is, the transmission system determines the number of CRCs to be inserted into the code and CRC insertion positions based on the total code length, the number of information bits, and the set SNR, by analyzing the graphs described in FIGS. 1 and 2.

The transmission system inserts the CRCs into the CRC insertion positions and then encodes the signal with polar codes (S110). Here, the transmission system sets, as one code section, a section ranging from the first bit to the code section end bit which is the position where the last bit of the first CRC is inserted. In addition, the transmission system sets, as another code section, a section ranging from the next bit of the code section end bit of the first CRC to the code second end bit of the second CRC.

In an embodiment of the present disclosure, an example will be described in which a 1024-bit signal includes 512 information bits, and when the SNR is 2, the CRC is inserted into four bits and the total 1024-bit code is divided into 4 code sections.

For example, it is assumed that as a result of analyzing the graph of FIG. 2, the transmission system determines that the respective last bits of the four CRCs are inserted into the 253rd bit, the 484th bit, the 713th bit, and the 841st bit in the entire code. Then, the section ranging from the first bit to the 253rd bit is a first code section, and the section ranging from the 254th bit to the 484th bit is a second code section. Likewise, the section ranging from the 485th bit to the 713th bit is a third code section, and the section ranging from the 714th bit to the 841st bit is a fourth code section.

After inserting the CRCs and encoding it with polar codes as described above, the transmission system transmits code section information together with the encoded signal to the decoding system, which is a reception system (S120). A technique for generating a CRC and inserting it into a signal and a method for encoding the signal with polar codes, which are performed by the transmission system, are known, and detailed descriptions thereof are omitted in the embodiment of the present disclosure.

A method for decoding a signal using an SC-flip algorithm by a reception system, that is, a decoding system, will be described with reference to FIG. 5, where the signal is encoded with polar codes after determining the CRC positions based on the error occurrence frequency in the system design process as described above.

Figure 5:
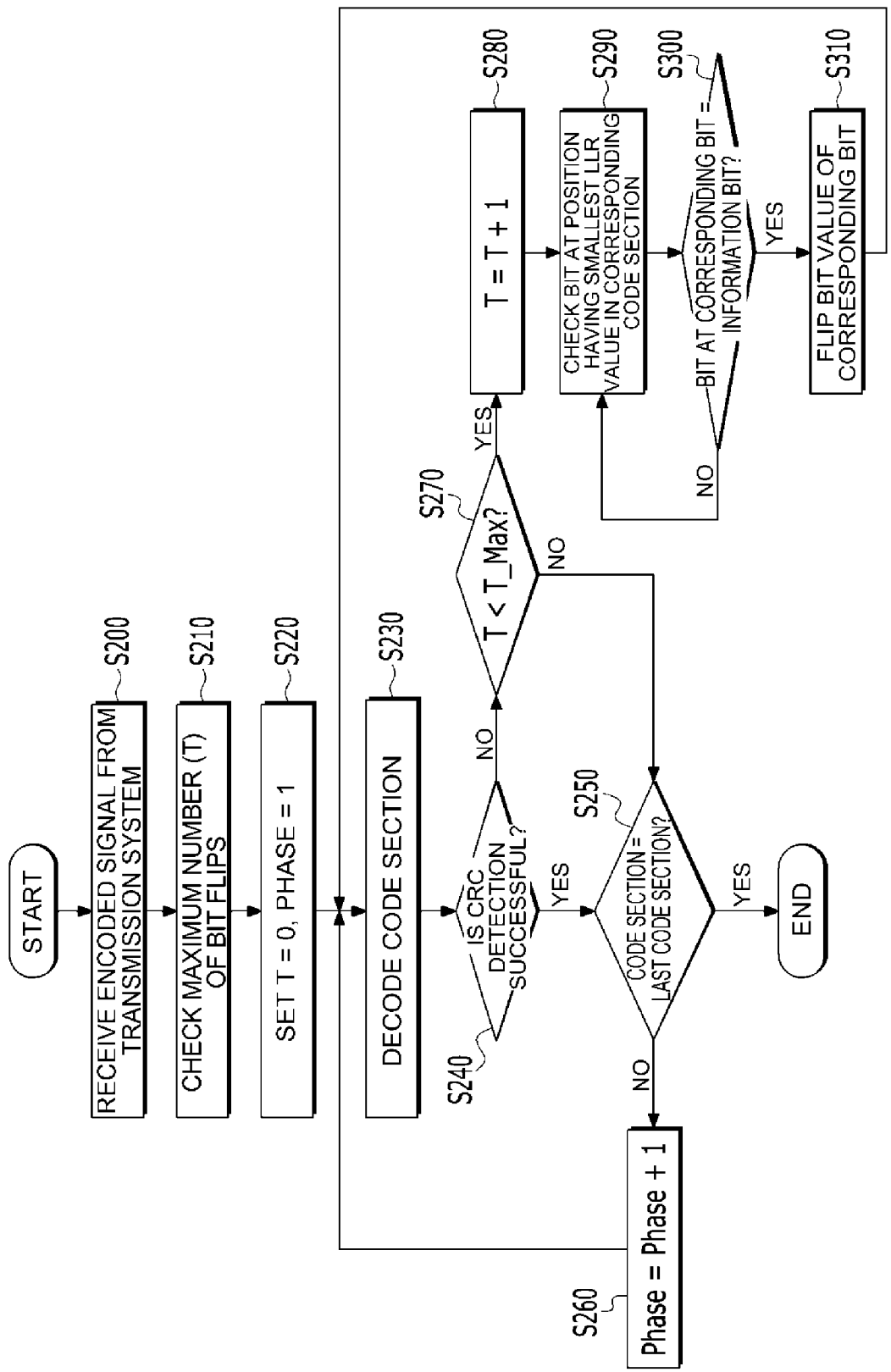
FIG. 5 is a flowchart of a decoding method using an SC-Flip algorithm according to an embodiment of the present disclosure.

FIG. 5 is a flowchart of a decoding method using an SC-Flip algorithm according to an embodiment of the present disclosure.

As illustrated in FIG. 5, when a decoding system receives an encoded signal from a transmission system (S200), the decoding system checks a preset maximum number T of bit flips (S210). Here, since the maximum number of bit flips or the method for setting the maximum number of bit flips may be performed in various ways, detailed descriptions thereof are omitted in the embodiment of the present disclosure.

Then, the decoding system initializes the number T of bit flips to 0 and sets a code section identification value (phase) to 1 (S220). The decoding system performs decoding from a first code section (S230). When the decoding system decodes the encoded codes bit by bit, the LLR values as many as the number of bits included in the code section are calculated.

The decoding system checks whether CRC detection is successful in a first code section (S240). Here, a method for decoding a signal encoded by a successive cancellation algorithm, a method for calculating LLR values, and a method for detecting a CRC, which are performed by the decoding system are known, and thus detailed descriptions thereof are omitted in the embodiment of the present disclosure.

The decoding system attempts to detect CRC when the last code section is a code section in which CRC is included. When the CRC detection is successful, the decoding system ends the code decoding procedure. Alternatively, when the last code section is a section in which CRC is not included and decoding is completed up to the last bit, the decoding system ends the code decoding procedure.

However, when the decoded code section is not the last code section, in order to decode the next code section adjacent to the decoded code section, the code section identification value is increased by one (code section+1), and the code decoding procedure for the next code section is performed.

However, when the CRC detection is not successful as a result of checking in step S240, the decoding system checks whether the current number of bit flips is less than the predetermined maximum number of bit flips checked in step S210 (S270). When the current number of bit flips is greater than the maximum number of bit flips, the procedure after step S250 is performed.

However, when the current number of bit flips is less than or equal to the maximum number of bit flips, the decoding system increases the number of bit flips by one (S280), and checks the bit at a position having the smallest LLR value in the corresponding code section (S290). That is, since the LLR values as many as the bits included in the code section are calculated when the decoding system decodes the code section in step S230, the decoding system checks the position having the smallest value among the information bit positions of the calculated LLR values.

The decoding system checks whether the bit included in the corresponding position is an information bit (S300), and flips the bit value of the corresponding bit when the bit is an information bit (S310). Then, the procedure after step S230 is repeated.

A process for performing decoding using the SC-Flip algorithm with the above-mentioned procedure will be described with reference to FIG. 6.

Figure 6:
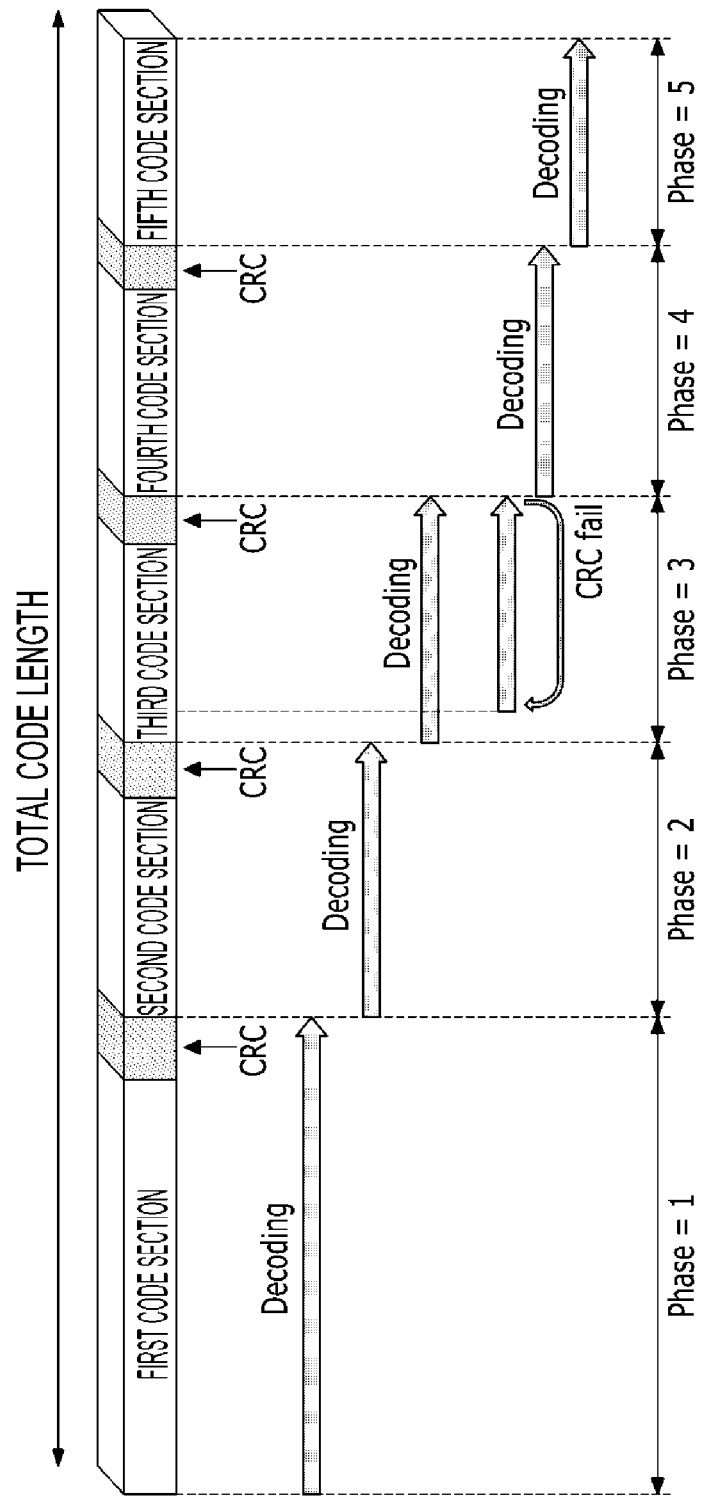
FIG. 6 is an exemplary diagram for illustrating a decoding process for an SC-Flip algorithm according to an embodiment of the present disclosure.

FIG. 6 is an exemplary diagram for illustrating a decoding process for an SC-Flip algorithm according to an embodiment of the present disclosure.

As illustrated in FIG. 6, whenever the last bit of the CRC inserted into the set position in the total code length is decoded, the decoding system performs the CRC check on the corresponding code section.

For example, as illustrated in FIG. 6, when the CRC detection fails in the third code section, the decoding system finds the minimum LLR in the third code section without the decoding procedure for the first code section and the second code section, flips the bit at the corresponding position of the LLR, and then re-performs the decoding process. Therefore, when using the SC-Flip algorithm according to the embodiment of the present disclosure, it is not necessary to repeat the decoding procedure for the all code sections.

In this case, the reason why the total code length is not uniformly divided into code sections is to bring the code section with high error frequency and the index where CRC detection occurs closer together, thereby reducing the decoding section and reducing the latency, as in the reason for code section division in FIGS. 1 and 2 above.

As described above, performances and decoding times when decoding polar codes according to the embodiment of the present disclosure and when decoding polar codes by using a method in the related art will be described with reference to FIGS. 7 and 8.

Figure 7:
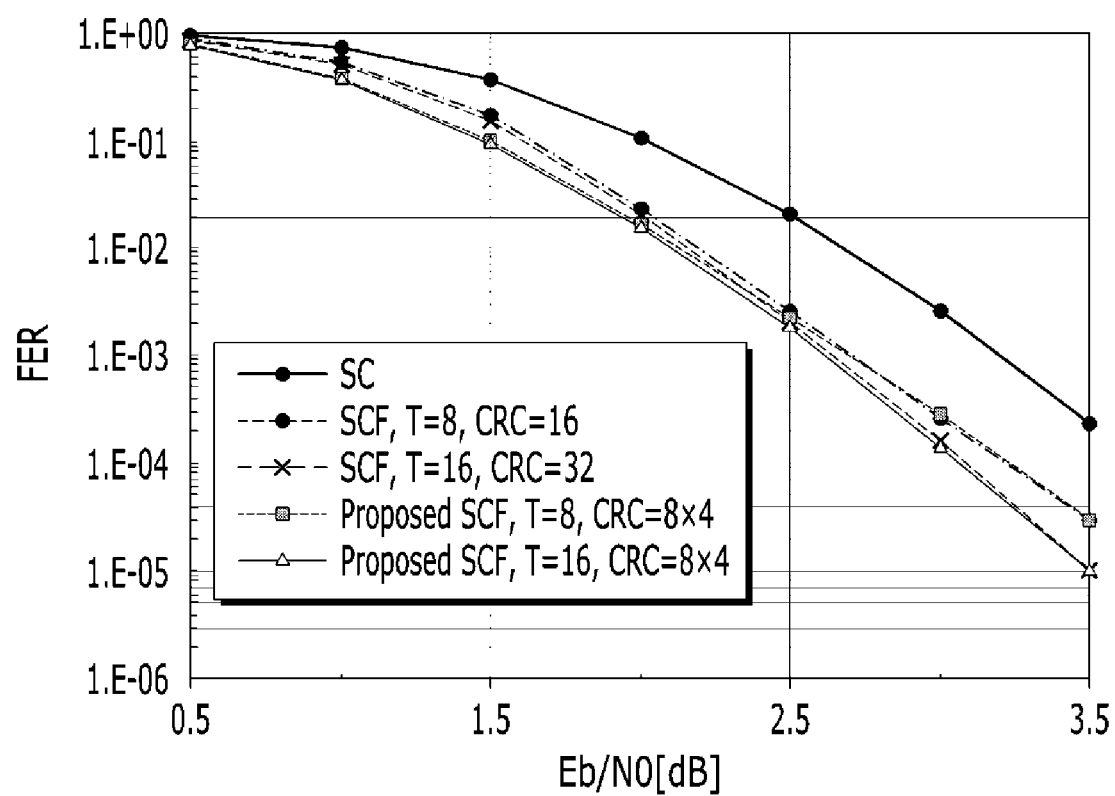
FIG. 7 is a graph showing a frame error rate of an SC-Flip algorithm according to an embodiment of the present disclosure.
Figure 8:
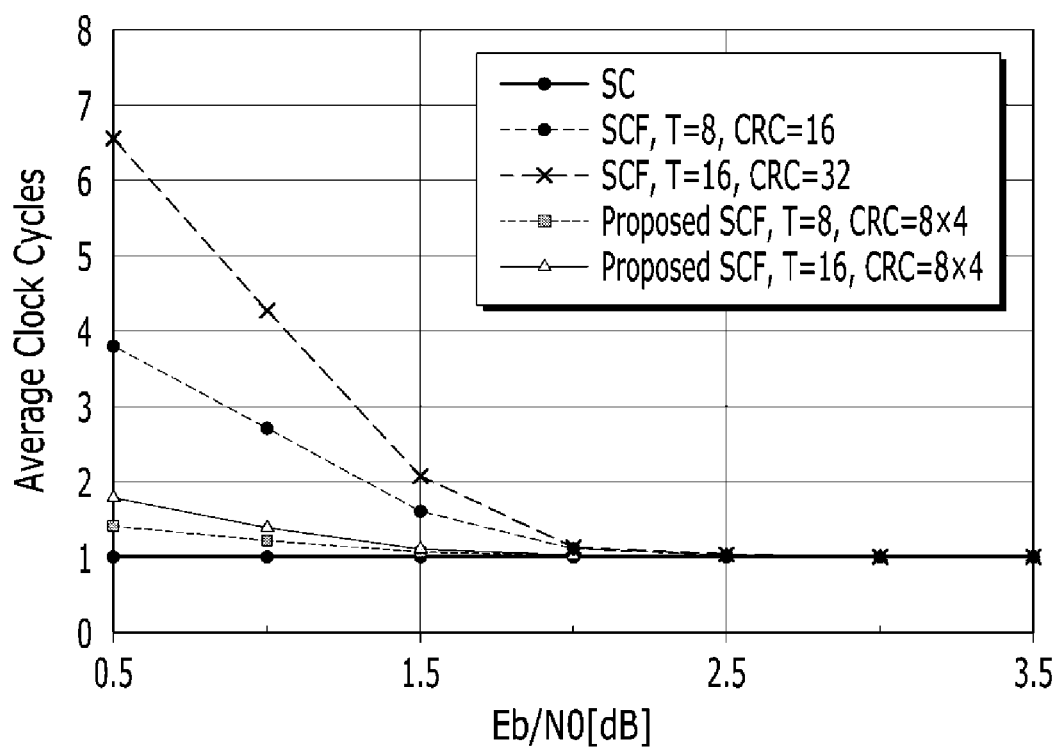
FIG. 8 is a graph showing an average decoding time of an SC-Flip algorithm according to an embodiment of the present disclosure.

FIG. 7 is a graph showing a frame error rate of an SC-Flip algorithm according to an embodiment of the present disclosure. Further, FIG. 8 is a graph showing an average decoding time of an SC-Flip algorithm according to an embodiment of the present disclosure.

As illustrated in FIG. 7, it can be seen that, even when decoding is performed using the SC-Flip algorithm according to the embodiment of the present disclosure, there is no significant degradation in error correction performance due to decoding of the polar codes using the existing SC-Flip algorithm. However, as illustrated in FIG. 8, it can be seen that, when decoding polar codes using the SC-Flip algorithm according to the embodiment of the present disclosure, the average decoding time is greatly reduced.

Figure 9:
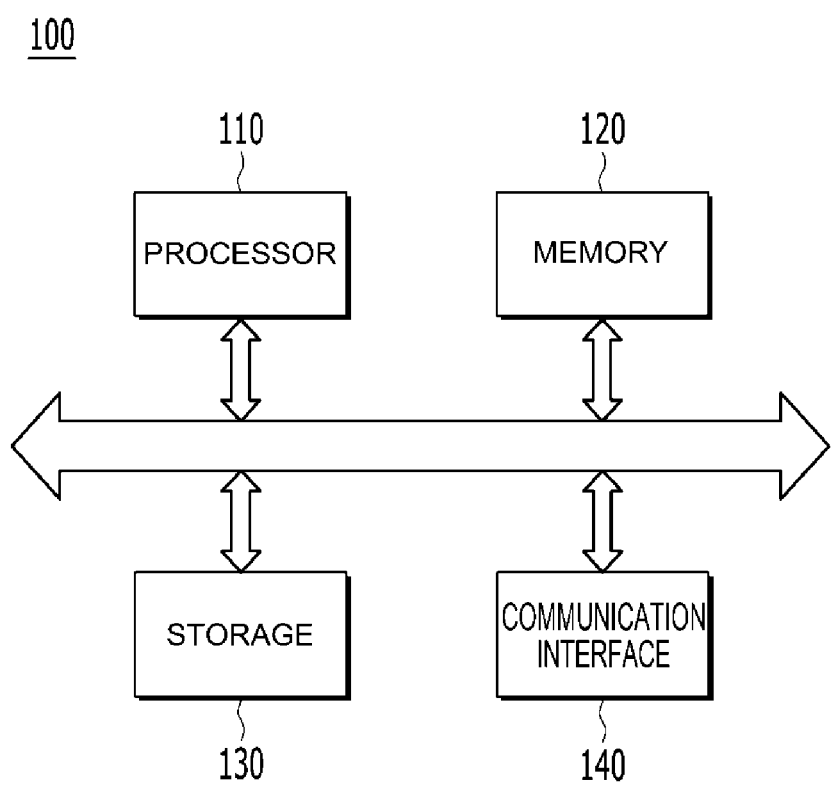
FIG. 9 is a hardware configuration diagram of a decoding system according to an embodiment of the present disclosure.

FIG. 9 is a hardware configuration diagram of a decoding system according to an embodiment of the present disclosure.

Referring to FIG. 9, a decoding system 100 operated by at least one processor to decode polar codes using the SC-Flip algorithm executes a program including instructions for executing the operation of the present disclosure. The program may be stored and distributed in a computer-readable storage medium.

The hardware of the decoding system 100 may include at least one processor 110, a memory 120, a storage 130, and a communication interface 140, which may be connected through a bus. In addition, hardware such as an input device and an output device may be included. The decoding system 100 may be loaded with various software including an operating system capable of driving a program. Furthermore, the decoding system 100 may include various components such as a modem and a co-processor, and may additionally include various components depending on an implementation method.

The processor 110 is a device that controls the operation of the decoding system 100, and may be various types of processors that execute instructions included in a program, for example including a central processing unit (CPU) or a microprocessor unit (MPU), a microcontroller unit (MCU), a graphic processing unit (GPU), and the like.

In order to deal with instructions that cause the processor 110 to execute the operation of the present disclosure, the memory 120 loads a corresponding program. The memory 130 may be, for example, read only memory (ROM), random access memory (RAM), or the like. The storage 130 stores various types of data, programs, or the like, required to execute the operation of the present disclosure. The communication interface 140 may be a wired/wireless communication module.

Although described in detail in the embodiments of the present disclosure, the scope of the present disclosure is not limited thereto, and it should be clearly understood that various modifications and improvements by those skilled in the art using the basic concept of the present disclosure, which is defined in the following claims, will also belong to the scope of the present disclosure.

What is claimed is:

1. A method for decoding a signal encoded with polar codes by a decoding system, the method comprising:
   receiving, from a transmission system, a signal in which a plurality of cyclic redundancy checks (CRCs) are encoded by the polar codes, the plurality of CRCs being inserted into positions determined based on error occurrence frequencies of a plurality of information bits, the number of the plurality of information bits and a total code length, wherein the total code length is non-uniformly divided into code sections;
   decoding a code section including bits ranging from a first bit of the signal to a position where a last bit of a first CRC is inserted;
   checking whether a CRC is detected in the code section;
   when the CRC is not detected in the code section, performing successive cancellation flip decoding for the decoded code section; and
   when the CRC is detected in the decoded code section, determining whether to decode a next code section adjacent to the decoded code section,
   wherein the receiving of the signal comprises receiving the signal together with code section information which includes information on the number of the plurality of CRCs and information on the positions of the plurality of CRCs in the non-uniformly divided code sections.

2. The method of claim 1, wherein the decoding comprises:
   checking a preset maximum number of bit flips and initializing a number of bit flips for the code section; and
   checking log-likelihood ratio (LLR) values calculated by performing decoding from the first bit.

3. The method of claim 2, wherein the performing of the successive cancellation flip decoding comprises:
   checking whether a number obtained by increasing the number of bit flips by one is less than the maximum number of bit flips when the CRC is not detected; and
   performing the successive cancellation flip decoding for the code section when the obtained number is less than the maximum number of bit flips.

4. The method of claim 3, wherein the performing comprises:
   flipping a bit at a position having a smallest LLR value among the calculated LLR values; and
   performing decoding from the position of the flipped bit.

5. The method of claim 4, wherein the flipping of the bit comprises flipping an information bit when the bit at the position having the smallest LLR value is the information bit.

6. The method of claim 3, wherein the checking whether the CRC is detected in the code section comprises:
   checking whether the code section is a last code section of the signal when the CRC is detected; and
   decoding the next code section adjacent to the code section when the code section is not the last code section.

7. A decoding system for decoding a signal encoded with polar codes, the decoding system comprising:
   a communication interface configured to receive, from a transmission system, an encoded signal by being divided into a plurality of code sections based on insertion positions of a plurality of CRCs, wherein the encoded signal is a signal encoded with the polar codes by inserting the plurality of CRCs into the insertion positions determined based on error occurrence frequencies of a plurality of information bits, the number of the plurality of information bits and a total code length, the total code length being non-uniformly divided into the code sections; and
   a processor configured to:
   decode the encoded signal sequentially from a first code section,
   checking whether a CRC is detected in the first code section,
   when the CRC is not detected in the code section, perform successive cancellation flip decoding for a decoded code section of the plurality of code sections, and
   when the CRC is detected in the code section, determine whether to decode another code section adjacent to the code section,
   wherein the communication interface is configured to receive the encoded signal together with code section information which includes information on the number of the plurality of CRCs and information on the insertion positions of the plurality of CRCs in the non-uniformly divided code sections.

8. The decoding system of claim 7, wherein the processor is further configured to increase a number of bit flips set for bit-flipping decoding by one and check whether the number of bit flips is less than a preset maximum number of bit flips when the CRC is not detected in the code section, and perform the successive cancellation flip decoding for the code section when the number of bit flips is less than the maximum number of bit flips.

9. The decoding system of claim 8, wherein the processor is further configured to flip a bit at a position having a smallest LLR value among LLR values calculated by decoding the code section, and perform decoding from the position of the flipped bit.

10. The decoding system of claim 8, wherein the processor is further configured to check whether the code section is a last code section of the signal when the CRC is detected in the code section, and decode the other code section adjacent to the code section when the code section is not the last code section.

* * * * *